(12) United States Patent
Ali

(10) Patent No.: US 7,119,584 B1
(45) Date of Patent: Oct. 10, 2006

(54) SIGNAL SAMPLERS AND BUFFERS WITH ENHANCED LINEARITY

(75) Inventor: Ahmed Mohamed Abdelatty Ali, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 158 days.

(21) Appl. No.: 10/897,483

(22) Filed: Jul. 23, 2004

(51) Int. Cl.
*G11C 27/02* (2006.01)
*H03K 5/00* (2006.01)

(52) U.S. Cl. .......................................... 327/91; 330/311
(58) Field of Classification Search ................. 327/91, 327/94, 480–483, 491, 478, 554
See application file for complete search history.

(56) References Cited

U.S. PATENT DOCUMENTS

| | | | |
|---|---|---|---|
| 6,028,459 A | 2/2000 | Birdsall et al. ............... | 327/94 |
| 6,570,411 B1 * | 5/2003 | Bardsley et al. ............. | 327/94 |
| 6,642,752 B1 | 11/2003 | Nagaraj ....................... | 327/94 |
| 6,650,263 B1 | 11/2003 | Dillon ........................ | 341/122 |
| 6,677,807 B1 | 1/2004 | Brokaw ....................... | 327/538 |
| 6,778,013 B1 * | 8/2004 | Ali ............................. | 330/252 |

OTHER PUBLICATIONS

Jakonis, Darius, "RF Sampling Receiver", Department of Electrical Engineering, Linkoping University, Linkoping, Sweden, 4 pages.
Boni, Andrea, "A 10-bit 185-MS/s Track-and-Hold in 0.35um CMOS", IEEE Journal of Solid-State Circuits, vol. 36, No. 2, Feb. 2002, pp. 195-203.

* cited by examiner

*Primary Examiner*—My-Trang Nu Ton
(74) *Attorney, Agent, or Firm*—Koppel, Patrick & Heybl

(57) ABSTRACT

The invention recognizes that sampler linearity is degraded because transfer voltage across a sampler's buffer varies with amplitude of the analog signal being sampled. Because this transfer voltage is in the signal path it modulates the signal and distorts the resulting sample. In the invention, sampler embodiments are provided which include replica current generators that provide and route sample currents to sample capacitors so that an associated buffer transistor can transfer a faithful copy of the analog signal's potential to the sample capacitor and thereby significantly enhance the sampler's linearity. The replica current generators generally include a replica load that mimics the sample load driven by the buffer transistor.

31 Claims, 9 Drawing Sheets

SIGNAL SAMPLERS AND BUFFERS WITH ENHANCED LINEARITY

BACKGROUND OF THE INVENTION

1. Field of the Invention

The present invention relates generally to signal samplers and buffers.

2. Description of the Related Art

Buffer amplifiers (a term often shortened to buffers) are generally used to couple signals between upstream and downstream circuit elements and they are preferably configured to provide a high degree of isolation between these elements. Signal samplers are generally used to provide a sample of an analog signal to a downstream circuit element in a first sampler mode and isolate the analog signal from the downstream circuit element in a second sampler mode. Unfortunately, it has often been found that samplers and buffers fail to also provide a sufficient degree of linearity as they process the signals with the result that signal distortion is introduced.

BRIEF SUMMARY OF THE INVENTION

The present invention is directed to sampler and buffer structures that provide enhanced processing linearity. The novel features of the invention are set forth with particularity in the appended claims. The invention will be best understood from the following description when read in conjunction with the accompanying drawings.

DETAILED DESCRIPTION OF THE INVENTION

It has been determined that sampler linearity is degraded because transfer voltage across a sampler's buffer varies with amplitude of the analog signal being sampled. Because this transfer voltage is in the signal path it modulates the signal and distorts the resulting sample. In response to this determination, the invention provides replica current generators that generate and route sample currents to sample capacitors so that the buffer can transfer a faithful copy of the analog signal to the sample capacitor and thereby significantly enhance the sampler's linearity. The replica current generators generally include a replica load that mimics the sample load driven by the buffer transistor. This facilitates the generation of a replica current that closely matches the required sample current.

Figure 1:
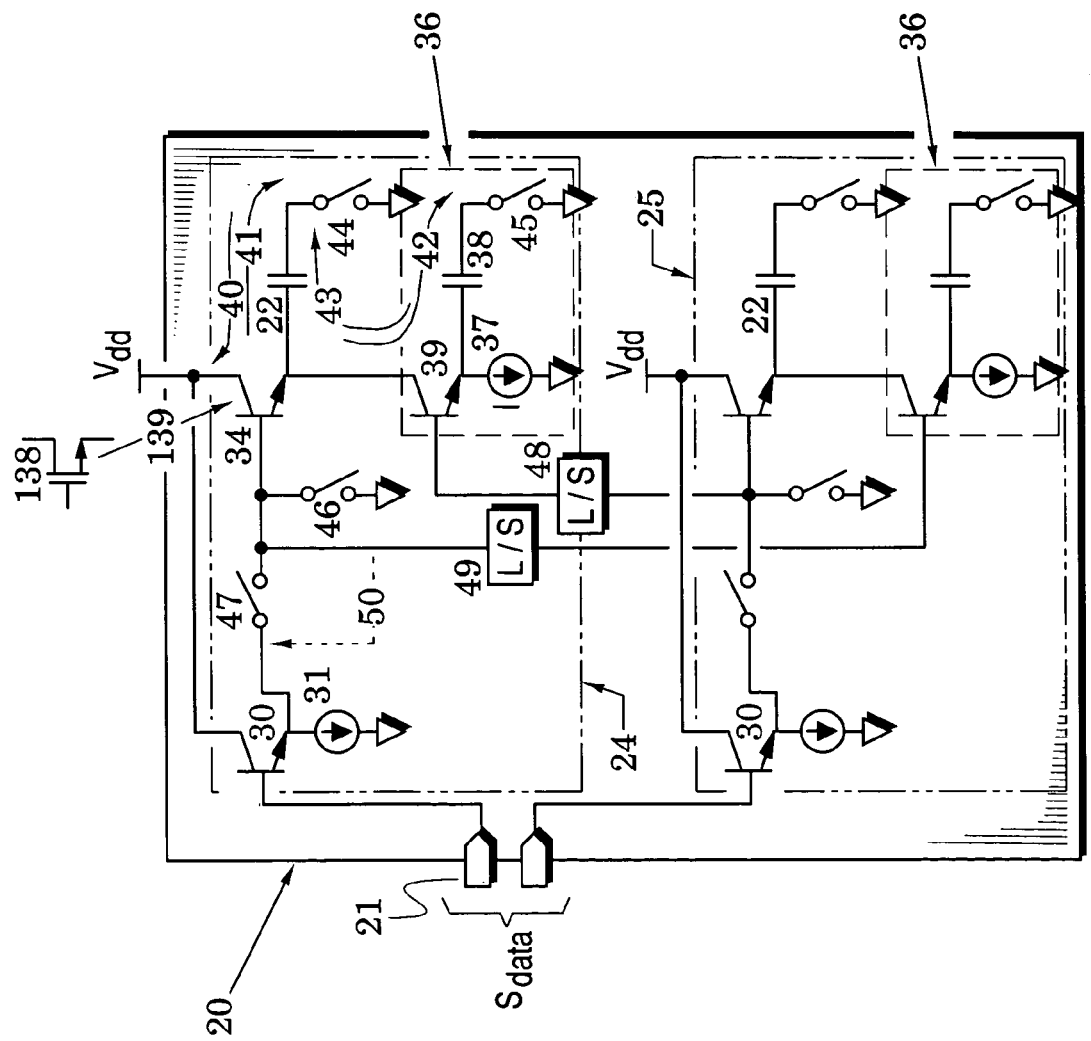
FIGS. 1–8 are schematics of sampler embodiments of the present invention with buffer embodiments also included.

In particular, FIG. 1 illustrates a sampler 20 which is shown in a differential embodiment in which it receives an analog signal at an input port 21 and provides samples of the analog signal on differential sample capacitors 22 by differentially driving identical upper and lower sampler portions 24 and 25. To enhance description simplicity and clarity, the following descriptions of figures are directed to upper sampler portions with references to lower portions inserted where necessary and convenient. To enhance drawing simplicity, reference numbers are generally shown in the upper sampler portions with the understanding that they also apply to similar elements in the lower sampler portions.

The upper sampler portion 24 of FIG. 1 includes the sample capacitor 22, an upstream buffer transistor 30 for receiving the analog signal, a corresponding upstream current source 31, and a downstream buffer transistor 34 that is positioned between the sample capacitor 22 and the upstream buffer transistor 30 to successively couple a sample of the analog signal to the sample capacitor 22 in first sampler operational modes and successively isolate the sample capacitor 22 from the analog signal in second sampler operational modes.

The upper sampler portion 24 also includes a downstream replica current generator 36 wherein this generator and the downstream buffer transistor 34 respond to opposite polarities of the analog signal. In particular, the downstream replica current generator has a replica current source 37, a replica capacitor 38 and a replica transistor 39 that couples the replica current source and the replica capacitor to the downstream buffer transistor 34.

In the sampler embodiment 20, the upstream and downstream buffer transistors 30 and 34 and the replica transistor 39 are configured as transistor followers. They are shown as bipolar junction transistor (BJT) emitter followers in FIG. 1 but other follower embodiments (e.g., metal-oxide-semiconductor (CMOS) source followers) may be used in other sampler embodiments.

In operation of the sampler 20, the downstream buffer transistor 34 is successively activated so that, in response to the analog signal, it directs successive sample currents through the sample capacitor 22 to successively alter its sample charge. The directions and magnitudes of the sample currents are determined by the successive instantaneous values of the analog signal and are therefore indicated by bidirectional sample currents 40 and 41. After each activation, the downstream buffer transistor is deactivated and the captured sample charge is generally processed by additional circuits (not shown) associated with the sampler.

As the amplitude and direction of the sample currents successively changes, so does the base-emitter voltage $V_{be}$ of the downstream transistor 34 (greater base-emitter voltages go along with greater sample currents) and because this voltage is in the signal path, it modulates and degrades the accuracy of the samples. That is, the voltage applied at the downstream buffer transistor's emitter to charge the sample capacitor 22 is not a faithful copy of the analog signal at the downstream buffer transistor's base. In the absence of the present invention, this modulation of the analog signal significantly degrades the sampler's linearity.

In the downstream replica generator 36, the replica transistor 39 responds to the opposite polarity of the analog signal (via the upstream buffer transistor 30 of the lower sampler portion 25). Therefore, the replica transistor 39 directs successive replica currents through the replica capacitor 38 whose directions and magnitudes are determined by the opposite analog signal polarity and, accordingly, they are indicated by bidirectional currents 42 and 43 whose directions through the replica capacitor are respectively opposite the directions of the sample currents 40 and 41 through the sample capacitor 22.

Because the current source 37 controls its current to be a constant current I, the replica currents 42 and 43 are directed through the replica transistor's collector and past the high output impedance of the downstream buffer transistor 34 and into the sample capacitor 22. This current path redirects the replica currents 42 and 43 to be in phase respectively with the sample currents 40 and 41. In an important feature of the invention, the sample capacitor 38 is configured with a capacitance substantially equal to that of the sample capacitor 22 so that the magnitudes of the replica currents 42 and 43 respectively equal the magnitudes of the sample currents 40 and 41.

The replica currents thus replace the sample currents so that the sample currents through the downstream buffer transistor 34 are substantially eliminated. Accordingly, the downstream buffer transistor's base-emitter voltage $V_{be}$ remains substantially constant and the voltage placed on the sample capacitor 22 is substantially a faithful copy of the analog signal. Essentially, the replica transistor 39 provides the necessary sample currents to the sample capacitor 22 so that the downstream buffer transistor 34 can transfer a faithful copy of the analog signal's potential to the sample capacitor and thereby significantly enhance the sampler's linearity.

As stated above, the sample charges on the sample capacitor 22 are generally processed by circuits associated with the sampler. In FIG. 1, for example, a downstream switch 44 couples the bottom plate of the sample capacitor to ground in the first sampler mode and is opened in the second sampler mode. The bottom plate may be coupled to one input of a differential amplifier (not shown) and another switch (not shown) may then couple the capacitor's top plate to various reference voltages in the second sampler modes to thereby direct the accumulated charges in the sample capacitor into another capacitor coupled about the differential amplifier.

To insure that the replica currents 42 and 43 faithfully match and thus replace the sample currents 40 and 41, it is important that the total replica load faithfully match the sampler load. Therefore, a similar replica switch 45 is inserted in series with the replica capacitor 38 to match the series combination of the sample capacitor 32 and the added downstream switch 44.

As mentioned above, the downstream buffer transistor 34 isolates the sample capacitor 22 from the analog signal in the second sampler modes. Although the downstream current gain (upstream current loss) of this transistor also acts to significantly reduce the effect of spurious signals (e.g., switching transients initiated by the downstream switch 44) on upstream circuits during the first sampler modes, it has been found advantageous to enhance this upstream isolation in the first sampler modes by providing the upstream buffer transistor 30 whose downstream current gain (upstream current loss) further reduces spurious effects.

In the successive operations described above, the downstream buffer transistor 34 successively couples samples of the analog signal to the sample capacitor in the first sampler modes and successively isolates the sample capacitor in the second sampler modes. In the embodiment of FIG. 1, these operational modes are realized with a mode switch 46 that successively opens to allow the downstream buffer transistor 34 to couple the analog signal to the sample capacitor 22 and successively grounds this transistor's base to turn it off and thus isolate the analog signal from the sample capacitor. Because the mode switch 46 would otherwise disturb biasing of the upstream buffer transistor 34, an upstream switch 47 is preferably positioned between these elements so that this switch can be opened in the second sampler modes when the mode switch is closed.

It is noted that the common-mode level of the differential analog signal at the input port 21 is depressed by two diode drops as it transitions through the upstream and downstream buffer transistors 30 and 34 in the upper sampler portion 24. In contrast, it is depressed by a single diode drop as it transitions through the corresponding upstream buffer transistor of the lower sampler portion 25.

Because these diode drops would place a forward bias on the base-to-collector junction of the replica transistor, the sampler 20 positions a level shifter 48 in the base of the replica transistor which is configured (e.g., with a forward-biased diode) to insert a voltage drop that sufficiently depresses this base-to-collector junction to maintain a reverse bias that prevents saturation of the replica transistor. A corresponding level shifter 49 is provided for the replica transistor of the lower sampler portion 25. Although the level shifter 48 is coupled to the downstream side of the upstream switch 47 in FIG. 1, it can be moved to the upstream side in another sampler embodiment as indicated by the broken movement arrow 50.

Figure 2:
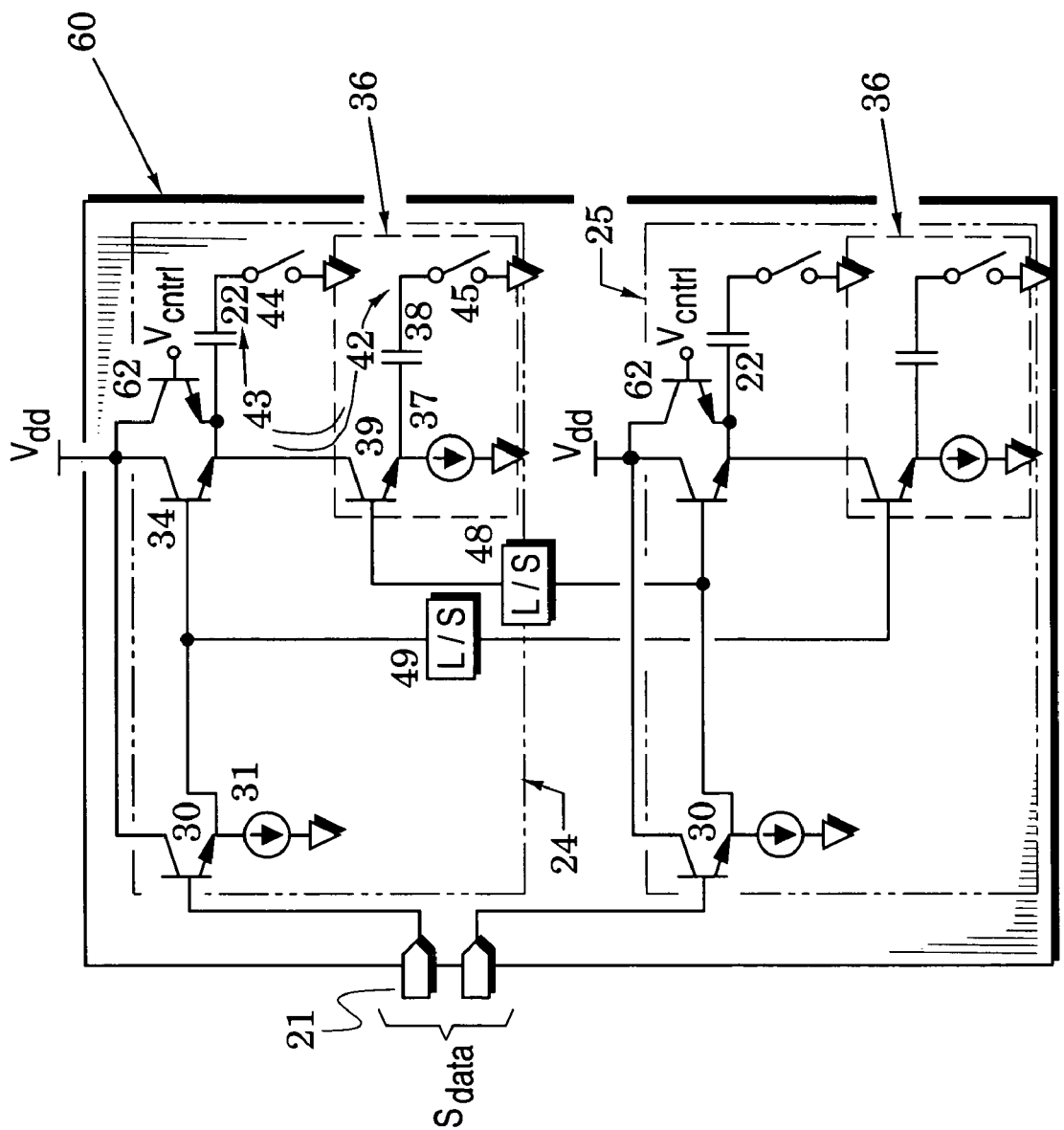

FIG. 2 illustrates another sampler 60 which includes elements of the sampler 20 with like elements indicated by like reference numbers. The sampler 60, however replaces the mode switch 46 with a mode transistor 62 that responds to a control voltage $V_{cntrl}$ and is coupled differentially with the downstream buffer transistor 34. In operation, the control voltage causes the mode transistor to control the first and second sampler modes by steering the current of the replica current source 37 away from the downstream buffer transistor in the second sampler modes.

This current steering turns the downstream buffer transistor off and isolates the sample capacitor 44 from the analog signal. Because it is no longer needed, the mode switch 46 is removed in FIG. 2. Several additional sampler embodiments are described below. Although not specifically shown, it should be understood that the mode switch modification of the sampler 60 can also be incorporated into modified embodiments of these additional samplers.

Figure 3:
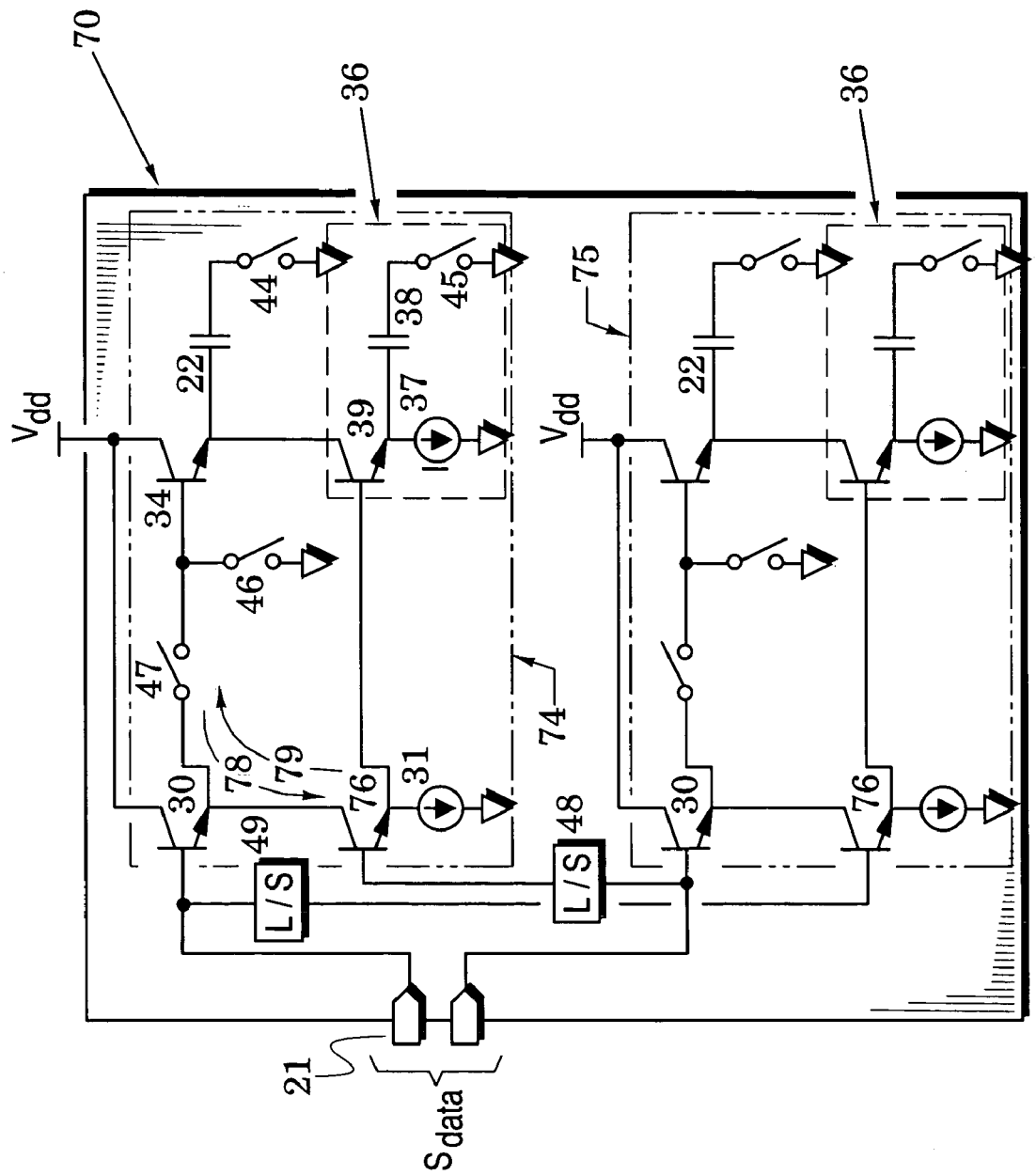

Another sampler embodiment 70 is illustrated in FIG. 3. The sampler 70 includes elements of the sampler 20 of FIG. 1 with like elements indicated by like reference numbers. In contrast, the sampler 70 modifies the upper and lower sampler portions to portions 74 and 75 in which an upstream replica current generator includes an upstream replica transistor 76 that has been inserted between the upstream buffer transistor 30 and its corresponding current source 31. In addition, the replica transistors 39 in the downstream replica current generators 36 are coupled to respond to their corresponding upstream replica transistors 76 and the level shifters 48 and 49 have been moved to couple the bases of the upstream replica transistors to opposite sides of the input port 21.

In response to the analog signal, the upstream replica transistors provide bidirectional currents 78 and 79 which replace corresponding currents in the upstream buffer transistors 30. Essentially, the upstream replica transistors provide sample currents so that the upstream buffer transistor 34 does not have to generate these currents and can, instead, simply provide a faithful copy of the analog signal to the downstream buffer transistors 34 and thereby further enhance the sampler's linearity. In this embodiment, the input signals to the replica transistors 39 are provided by their corresponding upstream replica transistors.

To insure that the replica currents 78 and 79 faithfully match and thus replace the corresponding currents in the upstream buffer transistor 30, it is important that the load driven by the upstream replica transistor 76 faithfully matches the load driven by the upstream buffer transistor. This is accomplished in the sampler 70 because the replica transistor 39 and the replica capacitor 38 essentially mimic the downstream buffer transistor 34 and the sample capacitor 22 so that the two loads are substantially the same.

Figure 4:
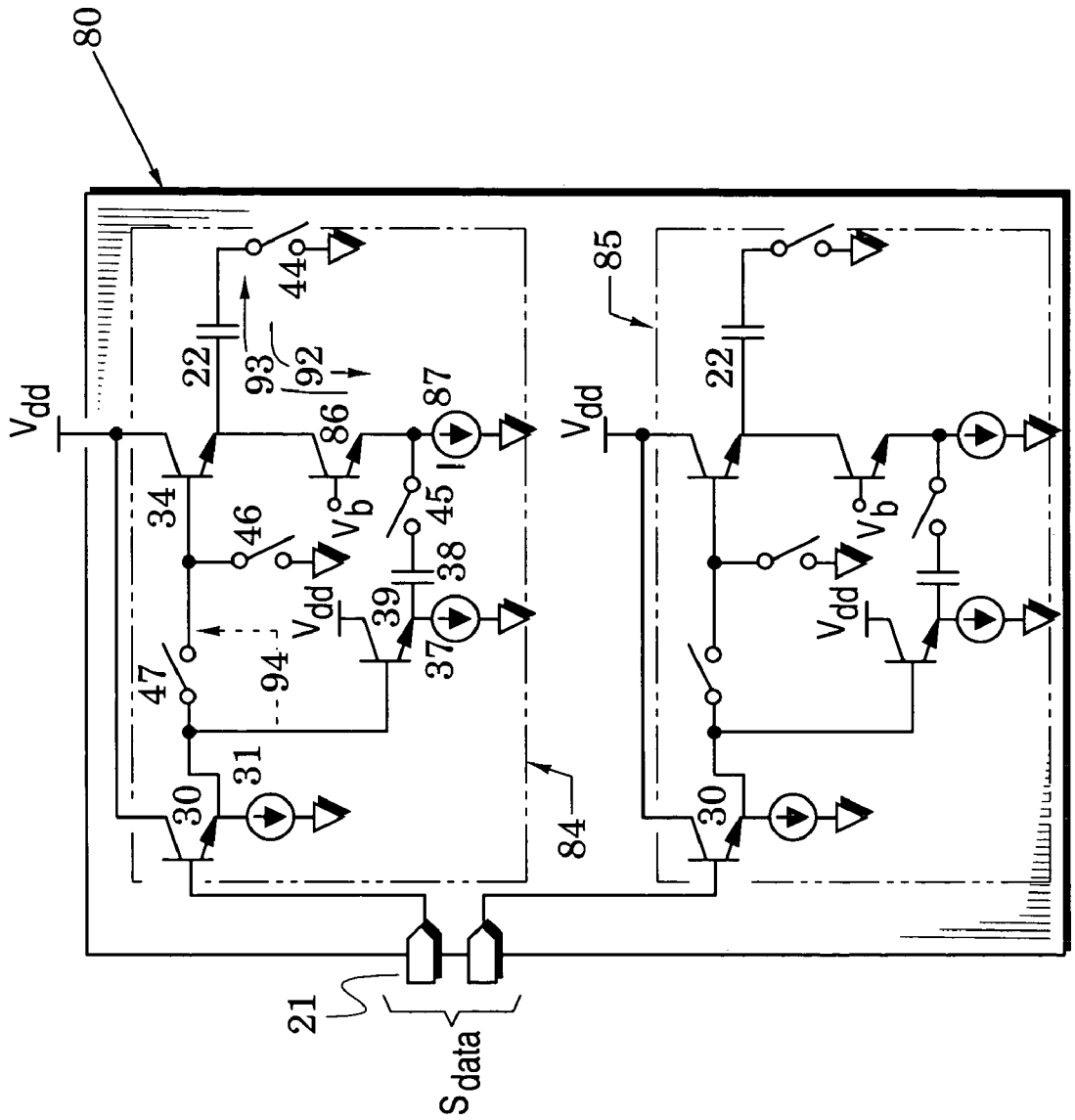

FIG. 4 illustrates a sampler embodiment 80 which includes elements of the sampler 20 of FIG. 1 with like elements indicated by like reference numbers. In contrast, the sampler 80 modifies the upper and lower sampler portions to portions 84 and 85 in which the replica transistor 39 has been altered to respond to the upstream buffer transistor 30 (to respond to the same signal polarity as its corresponding downstream buffer transistor). One side of the replica switch 45 remains coupled to the replica capacitor 38 but the other end is coupled to a folding current source 86 and a folding transistor 87 is inserted between this current source and the downstream buffer transistor 34. In this folded replica arrangement, a base bias $V_b$ is provided to the folding transistor.

The replica transistor 39 continues to generate currents similar to the replica currents 42 and 43 in FIG. 1 but, because it now responds to the same polarity of the analog signal as does the downstream buffer transistor 30, the current directions are reversed. Because the current source 87 controls its current to be a constant current I, these reversed replica currents are "folded" to pass through the folding transistor 86 and through the sample capacitor 22.

The result is the folded replica currents 92 and 93 which are shown with directions similar to the replica currents 42 and 43 of FIG. 1. Accordingly, the folded replica currents enhance the sampler's linearity in a manner similar to the replica currents 42 and 43 of FIG. 1. Although the replica transistor 39 is coupled to the upstream side of the upstream switch 47 in FIG. 4, it can be moved to the downstream side in another sampler embodiment as indicated by the broken movement arrow 94.

At this point it is noted that the downstream buffer transistor 34, the folding transistor 86, the folding current source 87, the replica transistor 39, the replica current source 37 and the replica capacitor comprise a buffer amplifier for impelling current in a signal load in response to an input signal and can thus be used in an extensive set of applications in addition to its use in the sampler 80 of FIG. 4. This buffer amplifier (a term generally shortened to buffer) is particularly suited for use as a buffer that provides enhanced linearity while also providing isolation via its high input impedance and low output impedance. This buffer can be used with both single-ended and differential input signals and with various transistor types (e.g., bipolar junction transistors and metal-oxide-semiconductor transistors).

Essentially, the replica transistor 39, the replica current source 38 and replica capacitor form a replica current generator that provides a replica current in response to the same input signal that drives the downstream buffer transistor and the folding current source 87 and folding transistor 86 form a current folder that receives the replica current and directs it to the downstream buffer transistor to supply a signal current in the buffer load (i.e., the sample capacitor 22). The linearity of the downstream buffer transistor is thereby enhanced because it does not supply the signal current.

Although, in FIG. 4, the buffer amplifier is shown in association with a capacitive load (the sample capacitor 22) and uses a capacitive replica (the replica capacitor 38), it can be generally applied to any signal load and corresponding replica load. As described above, the closer the replica load mimics the signal load, the more enhanced is the buffer amplifier's linearity.

Figure 5:
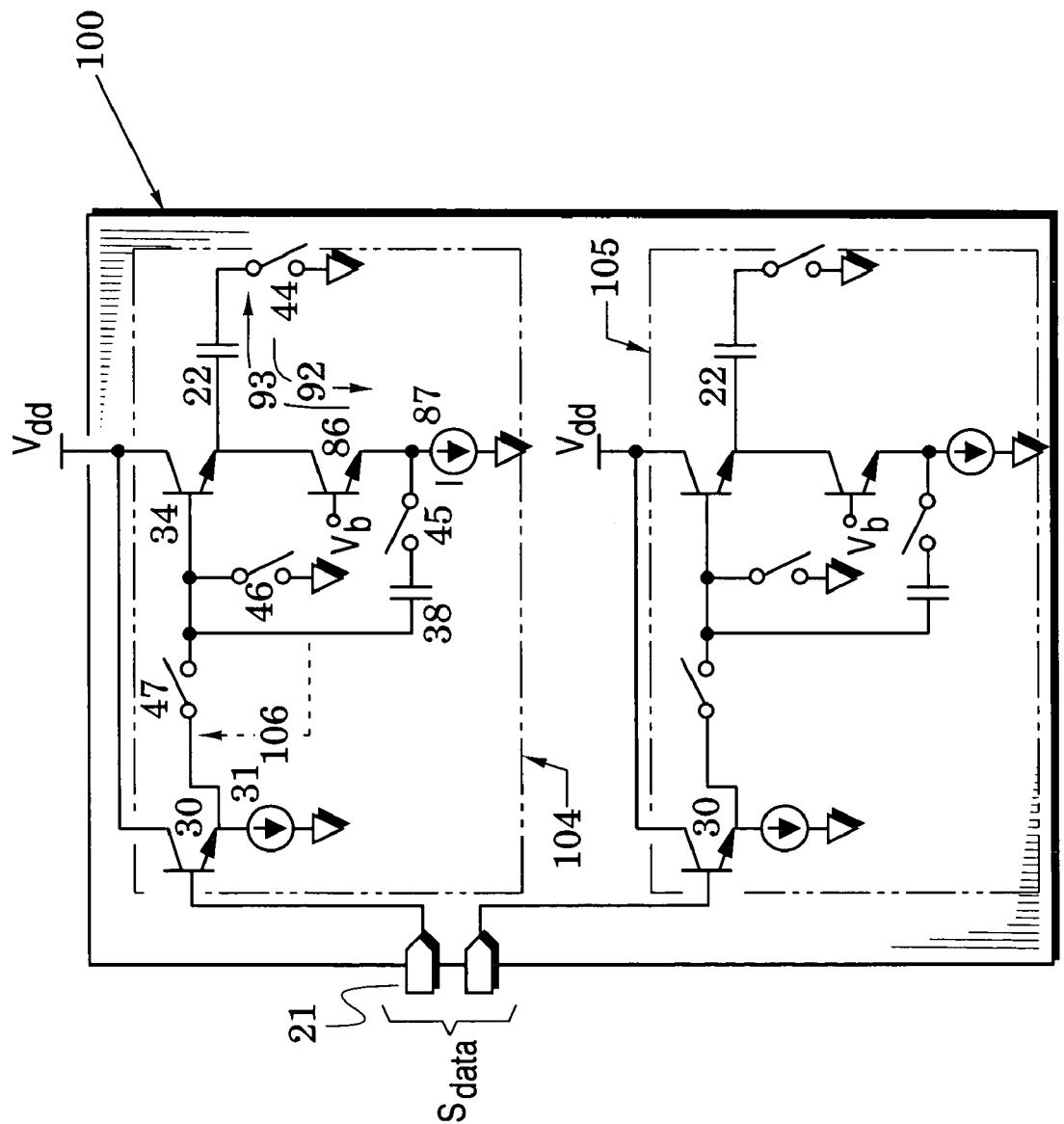

Another sampler embodiment 100 is illustrated in FIG. 5. This embodiment includes elements of the sampler 80 of FIG. 4 with like elements indicated by like reference numbers. In the sampler 100, however, it is realized that the upstream buffer transistor 30 can generate the replica currents in the replica capacitor 38 directly without the need for the intervening replica transistor 39.

Accordingly, the upper and lower sampler portions are modified to portions 104 and 105 by removing the replica transistor 39 and its replica current source 37 and coupling the replica capacitor 38 to be driven directly by the upstream buffer transistor 30. Although the embodiment 80 of FIG. 4 is more complex, it may enhance linearity because the upstream buffer transistor 30 does not have to directly drive the replica capacitor. Although the replica capacitor 38 is coupled to the downstream side of the upstream switch 47 in FIG. 5, it can be moved to the upstream side in another sampler embodiment as indicated by the broken movement arrow 106.

Figure 6:
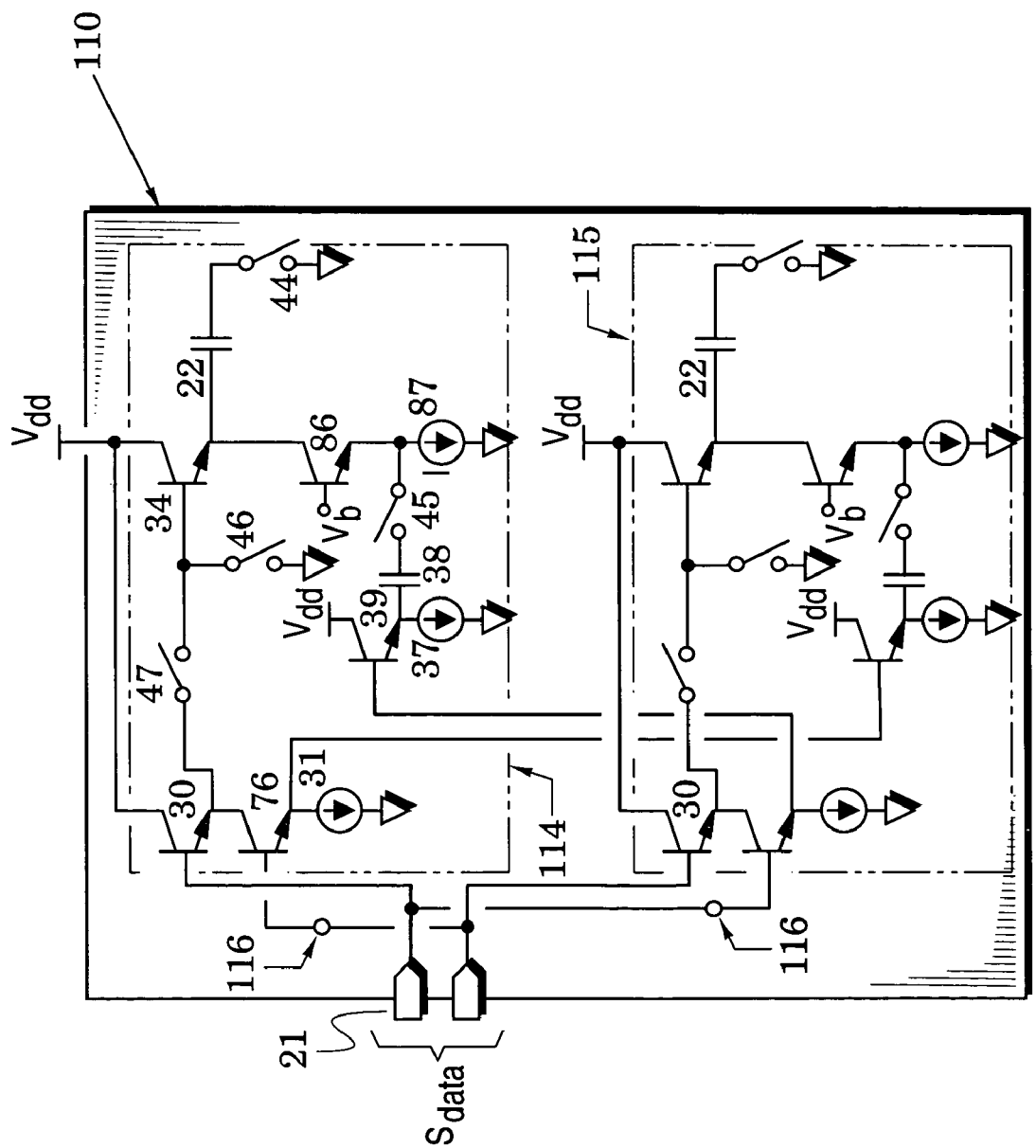

FIG. 6 illustrates another sampler 110 which includes elements of the sampler 80 of FIG. 4 with like elements indicated by like reference numbers. The sampler 110, however, modifies the upper and lower sampler portions to portions 114 and 115 in which, in each of upstream replica current generators, an upstream replica transistor 76 is inserted between the respective upstream buffer transistor 30 and its current source 31. Each replica transistor 39 now receives its drive signal from the upstream replica transistor 76 in a different sampler portion and each upstream replica transistor is driven by a polarity of the analog signal different from that received by its respective upstream buffer transistor 30.

The sampler 110 is thus similar to the sampler 70 of FIG. 3 wherein the replica current generator 36 of that sampler is modified to the folded replica arrangement introduced in the sampler 80 of FIG. 4. Because the folded arrangement folds the replica currents to form the folded replica currents (92 and 93 in FIG. 4), it is now necessary for each replica transistor 39 to receive its drive from the upstream replica transistor 76 in a different one of the sampler portions 114 and 115 (rather than from the same portion). Although not specifically shown in FIG. 6, the level shifters 49 and 48 of FIG. 3 should be inserted at positions 116 in FIG. 6.

Figure 7:
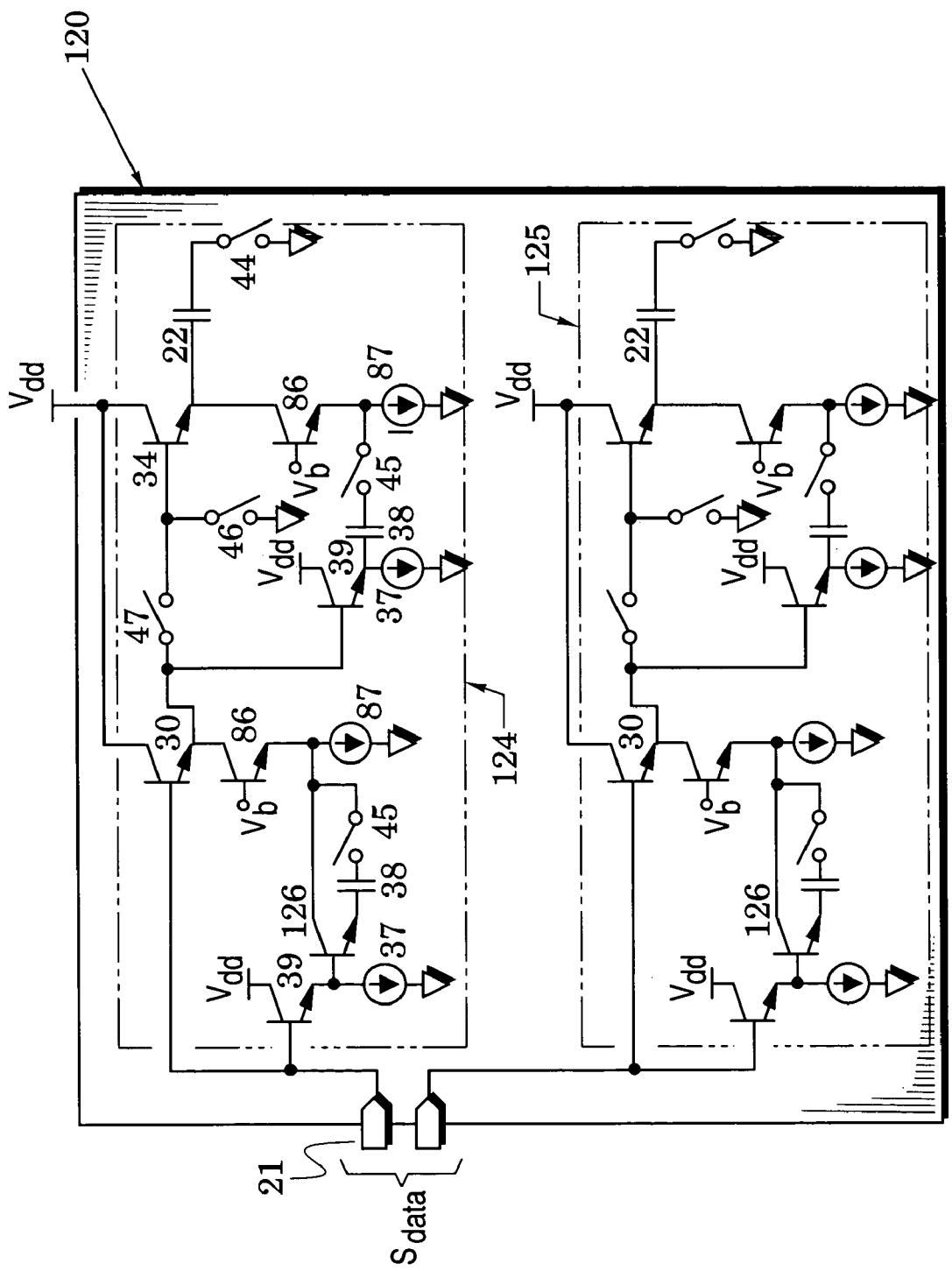

The sampler 120 of FIG. 7 includes elements of the sampler 80 of FIG. 4 with like elements indicated by like reference numbers. It is noted that the replica transistor 39 of the sampler 80 was provided with the same load as the downstream buffer transistor 34. That is, it has a load of the replica capacitor 38 and the replica switch 45 that mimics the sample capacitor 22 and the downstream switch 44. Then the folding current source 86 and folding transistor 87 were inserted between the replica switch and the downstream buffer transistor 34 to fold the replica currents.

The sampler 120 modifies the upper and lower sampler portions to portions 124 and 125 that provide a similar upstream replica current generator to generate replica currents for the upstream buffer transistor 30. Accordingly, another replica transistor 39 (and current source 37) receives the analog signal and drives a load to generate replica currents. Another folding current source 87 and folding transistor 86 are provided to fold the replica currents before coupling them to the upstream buffer transistor 30.

To insure that the replica currents faithfully match and thus replace currents in the upstream buffer transistor, it is important that the total replica load faithfully match the load driven by the upstream buffer transistor. Therefore, in each upstream replica current generator, a similar replica switch 45 is inserted in series with the replica capacitor 38 to match the series combination of the sample capacitor 32 and the added downstream switch 44. In addition, however, a replica buffer transistor 126 is inserted ahead of these elements to mimic the downstream buffer transistor 34 which is part of the load driven by the upstream buffer transistor.

Figure 8:
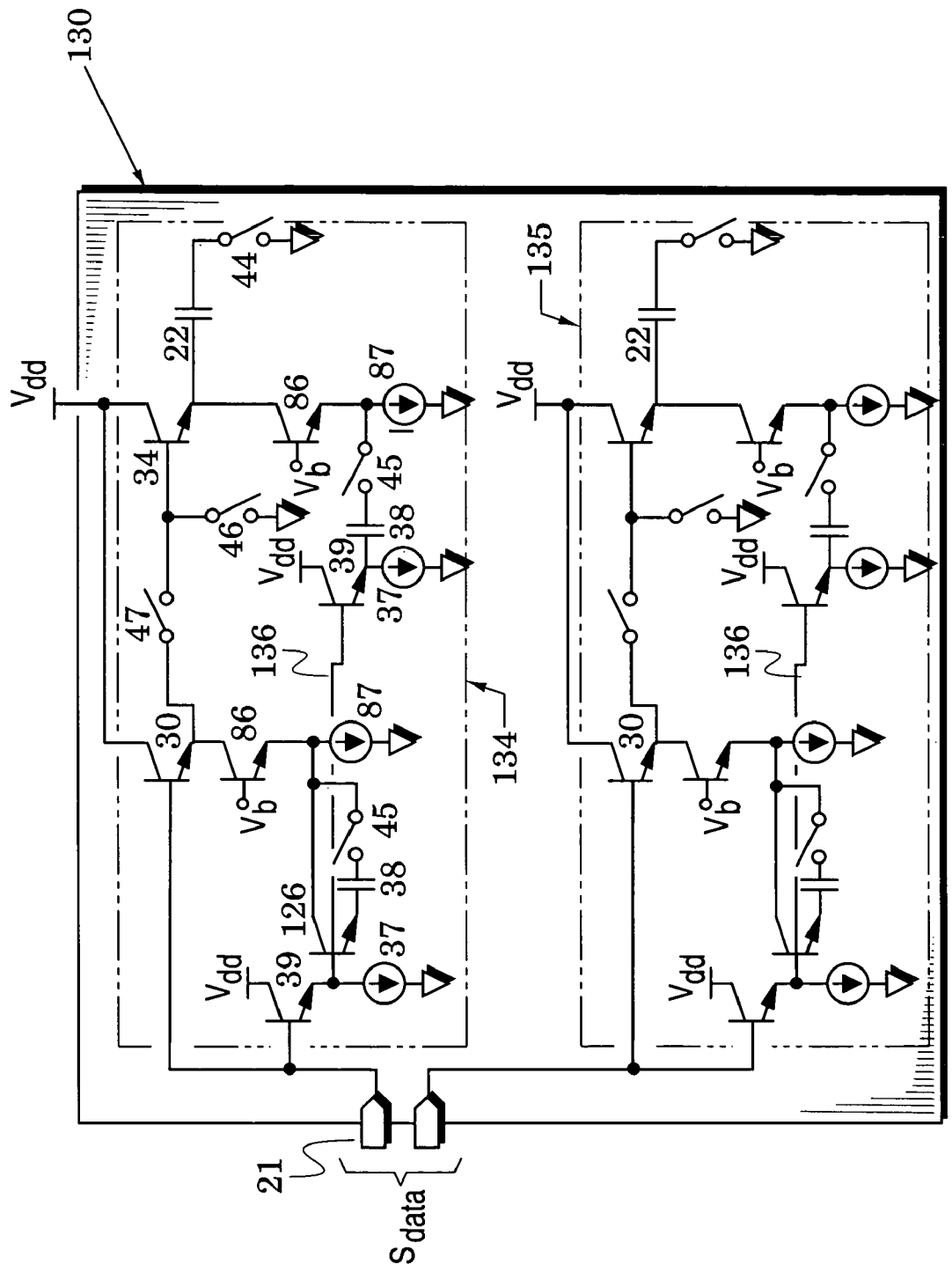

FIG. 8 illustrates a sampler 130 that includes elements of the sampler 120 of FIG. 7 with like elements indicated by like reference numbers. The sampler 130 notes that the downstream replica current generator can be driven from other sources than the upstream buffer transistor 30. It can be driven directly from the analog signal or, as shown in FIG. 8, from the upstream replica transistor 39. This is effected by modifying the upper and lower sampler portions to portions 134 and 135 in which coupling lines 138 are provided between the bases of the upstream and downstream replica transistors.

Figure 9:
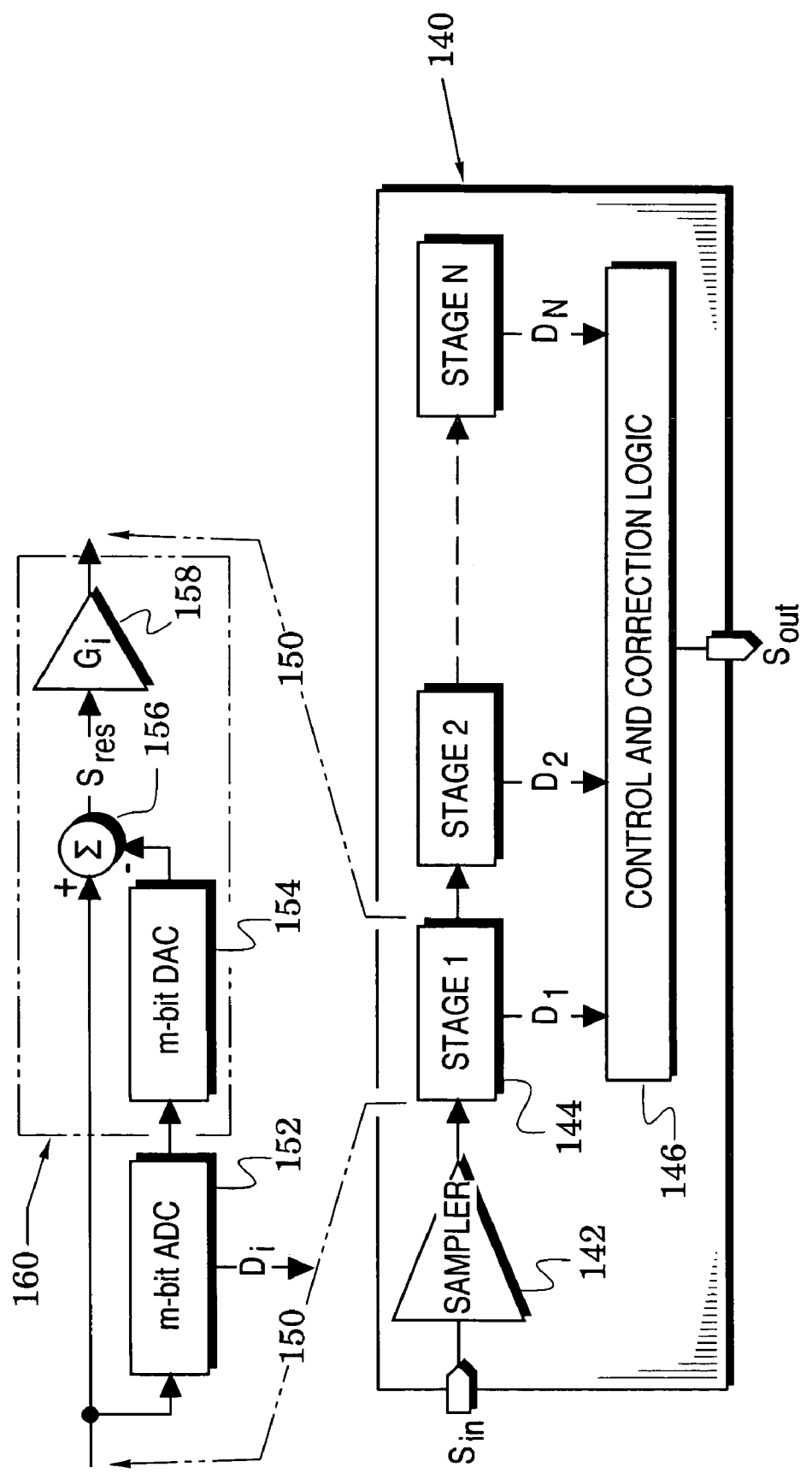
FIG. 9 is a block diagram of a pipelined analog-to-digital converter whose performance is enhanced by use of the sampler structures of FIGS. 1–8.

Samplers and buffers of the invention are suitable for use in a variety of signal-conditioning systems such as the exemplary pipelined analog-to-digital converter (ADC) 140 of FIG. 9 which includes a sampler 142 that provides samples of an analog input signal $S_{in}$ to N cascaded converter stages that successively convert each sample to a corresponding digital output signal $S_{out}$.

Each pipelined stage 144 converts a respective analog signal to that stage's predetermined number of digital bits and passes an amplified residue signal $S_{res}$ to a succeeding converter stage 144. As each succeeding stage converts its received residue signal, its preceding stage is converting a succeeding analog input signal. All converter stages, therefore, are simultaneously converting succeeding analog input signals to their respective digital bits with final converted words issuing from an associated control and correction logic 146 at the same rate as the sampling rate in the sampler 142.

Broken expansion lines 150 in FIG. 1 indicate that an exemplary converter stage comprises an ADC 152 which provides at least one corresponding digital bit $D_i$ and also comprises a digital-to-analog (DAC) 154 that converts this bit (or bits) to an analog signal which is subtracted in a summer 156 from this stage's respective analog input to form an analog residue $S_{res}$ that is amplified in a respective amplifier 158 with a respective gain G and passed to a successive converter stage for further conversion. The DAC 154, summer 156 and amplifier 158 are generally referred to as a multiplying digital-to-analog converter (MDAC) which is collectively shown as the broken-line element 160.

Generally, one or more redundant bits are generated in the converter stages and the control and correction logic 146 includes circuits (e.g., full adders) that use the bits of succeeding stages to correct preceding-stage errors that result from various degrading effects (e.g., offset and/or gain errors) and also includes circuits (e.g., shift registers) that time-align the corresponding digital bits.

In addition to the sampler 142, additional samplers may be positioned between converter stages to temporarily hold the residue signals and, thereby, facilitate conversion processing. The enhanced linearity of the samplers of the invention significantly improves the accuracy of the samples presented to the conversion stages of the ADC 140 and thereby significantly improves the performance of the ADC.

Although buffer amplifiers and samplers of the invention have been illustrated and described with reference to bipolar junction transistors, the teachings of the invention are directed to any transistors that have a control terminal and first and second current terminals that respond to the control terminal. Exemplary transistors for practicing the invention include bipolar junction transistors in which the control terminal and first and second current terminals are a base, an emitter and a collector and metal-oxide-semiconductor (MOS) transistors in which the control terminal and first and second current terminals are a gate, a source and a drain. An exemplary substitution of MOS transistors is shown in FIG. 1 in which an MOS transistor 138 is substituted for the downstream buffer transistor 34 as indicated by substitution arrow 139.

As noted above, many of the sampler embodiments can be used in single-ended and differential sampler arrangements although some are better suited to use in single-ended arrangements.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. An amplifier for impelling current in a signal load in response to an input signal, comprising:
   a buffer transistor having a buffer control terminal and first and second buffer current terminals responsive to said buffer control terminal wherein said first buffer current terminal is available to impel a desired load current in said signal load in response to said input signal at said buffer control terminal;
   a replica current generator that provides a replica current in response to said input signal; and
   a current folder that directs said replica current to said first buffer current terminal to thereby supply said load current.

2. The amplifier of claim 1, wherein said replica current generator includes:
   a replica transistor having a replica control terminal and first and second replica current terminals responsive to said replica control terminal wherein said replica control terminal receives said input signal;
   a replica current source coupled to said first replica current terminal; and
   a replica load that exchanges a replica current with said first replica current terminal;
   and said current folder includes:
   a folding current source; and
   a folding transistor having a folding control terminal and first and second folding current terminals responsive to said folding control terminal wherein said first folding current terminal is coupled to said folding current source and exchanges said replica current with said replica load and said second folding current terminal directs said replica current to said first buffer current terminal.

3. The amplifier of claim 2, wherein said replica load substantially matches said signal load.

4. The amplifier of claim 2, wherein said signal load and said replica load each include a capacitor.

5. The amplifier of claim 2, wherein said first current terminal, said second current terminal and said control terminal of said buffer transistor, said folding transistor and said replica transistor are respectively an emitter, a collector and a base.

6. The amplifier of claim 2, wherein said first current terminal, said second current terminal and said control terminal of said buffer transistor, said folding transistor and said replica transistor are respectively a source, a drain and a gate.

7. A sampler that provides samples of an analog signal, comprising:
   an upstream buffer transistor for receiving said analog signal;

a sample capacitor;

a downstream buffer transistor positioned between said sample capacitor and said upstream buffer transistor to couple a sample of said analog signal to said sample capacitor in a first sampler mode and isolate said sample capacitor from said analog signal in a second sampler mode; and at least one of an upstream replica current generator and a downstream replica current generator that respectively provide an upstream replica current and a downstream replica current to thereby reduce current variations in a respective one of said upstream and downstream buffer transistors;

wherein said downstream replica current generator and said downstream buffer transistor respond to opposite polarities of said analog signal;

wherein said downstream replica current generator includes:

a replica current source;

a replica capacitor; and a replica transistor coupled between said downstream buffer transistor and said replica current source and said replica capacitor;

wherein said downstream buffer transistor and said replica transistor are arranged as emitter followers to respectively drive said sample capacitor and said replica capacitor; and wherein said replica transistor receives an opposite polarity of said analog signal through a level shifter to prevent saturation of said replica transistor.

8. The sampler of claim 7, further including:

a downstream switch in series with said sample capacitor;

a mode switch arranged to control first and second sampler modes of said downstream buffer transistor; and an upstream switch positioned to isolate said mode switch from said upstream buffer transistor.

9. The sampler of claim 8, further including a replica downstream switch in series with said replica capacitor.

10. The sampler of claim 7, further including:

a downstream switch in series with said sample capacitor; and a mode transistor coupled to steer a current to thereby control said first and second sampler modes of said downstream buffer transistor.

11. A sampler that provides samples of an analog signal, comprising:

an upstream buffer transistor for receiving said analog signal;

a sample capacitor;

a downstream buffer transistor positioned between said sample capacitor and said upstream buffer transistor to couple a sample of said analog signal to said sample capacitor in a first sampler mode and isolate said sample capacitor from said analog signal in a second sampler mode; and at least one of an upstream replica current generator and a downstream replica current generator that respectively provide an upstream replica current and a downstream replica current to thereby reduce current variations in a respective one of said upstream and downstream buffer transistors;

wherein:

said upstream replica current generator and said upstream buffer transistor respond to opposite polarities of said analog signal; and said downstream replica current generator provides a replica current to said downstream buffer transistor in response to said upstream replica current generator.

12. The sampler of claim 11, wherein said upstream replica current generator includes:

an upstream replica current source; and an upstream replica transistor coupled between said upstream buffer transistor and said upstream replica current source;

and wherein said downstream replica current generator includes:

a downstream replica current source;

a downstream replica capacitor; and a downstream replica transistor that couples said downstream replica current source and said downstream replica capacitor to said downstream buffer transistor and responds to said upstream replica transistor.

13. The sampler of claim 12, wherein said upstream replica transistor receives an opposite polarity of said analog signal through a level shifter that inhibits saturation of said upstream replica transistor.

14. The sampler of claim 12, wherein:

said upstream and downstream buffer transistors are arranged as emitter followers to respectively drive said downstream buffer transistor and said sample capacitor; and said upstream and downstream replica transistors are arranged as emitter followers to respectively drive said downstream replica transistor and said downstream replica capacitor.

15. The sampler of claim 14, further including:

a downstream switch in series with said sample capacitor;

a mode switch arranged to control said first and second sampler modes of said downstream buffer transistor; and an upstream switch positioned to isolate said mode switch from said upstream buffer transistor.

16. The sampler of claim 14, further including:

a downstream switch in series with said sample capacitor; and a mode transistor coupled to steer a current to thereby control said first and second sampler modes of said downstream buffer transistor.

17. A sampler that provides samples of an analog signal, comprising:

an upstream buffer transistor for receiving said analog signal;

a sample capacitor;

a downstream buffer transistor positioned between said sample capacitor and said upstream buffer transistor to couple a sample of said analog signal to said sample capacitor in a first sampler mode and isolate said sample capacitor from said analog signal in a second sampler mode; and at least one of an upstream replica current generator and a downstream replica current generator that respectively provide an upstream replica current and a downstream replica current to thereby reduce current variations in a respective one of said upstream and downstream buffer transistors;

wherein said downstream replica current generator provides a replica current to said downstream buffer transistor in response to said upstream buffer transistor.

18. The sampler of claim 17, wherein said downstream replica current generator includes:
  a folding current source;
  a replica capacitor that couples said folding current source to said upstream buffer transistor; and
  a folding transistor that couples said replica capacitor to said downstream buffer transistor.

19. The sampler of claim 18, further including:
  a replica transistor inserted between said upstream buffer transistor and said replica capacitor; and
  a replica current source coupled to said replica transistor.

20. The sampler of claim 19, wherein:
  said downstream buffer transistor and said replica transistor are arranged as emitter followers to respectively drive said sample capacitor and said replica capacitor; and
  said upstream buffer transistor and said folding transistor are arranged as emitter followers to respectively drive said downstream buffer transistor and said folding current source.

21. The sampler of claim 20, further including:
  a downstream switch in series with said sample capacitor;
  a mode switch arranged to control first and second sampler modes of said downstream buffer transistor; and
  an upstream switch positioned to isolate said mode switch from said upstream buffer transistor.

22. The sampler of claim 21, further including a replica downstream switch in series with said replica capacitor.

23. The sampler of claim 20, further including:
  a downstream switch in series with said sample capacitor; and
  a mode transistor coupled to steer a current to thereby control said first and second sampler modes of said downstream buffer transistor.

24. A sampler that provides samples of an analog signal, comprising:
  an upstream buffer transistor for receiving said analog signal;
  a sample capacitor;
  a downstream buffer transistor positioned between said sample capacitor and said upstream buffer transistor to couple a sample of said analog signal to said sample capacitor in a first sampler mode and isolate said sample capacitor from said analog signal in a second sampler mode; and
  at least one of an upstream replica current generator and a downstream replica current generator that respectively provide an upstream replica current and a downstream replica current to thereby reduce current variations in a respective one of said upstream and downstream buffer transistors;
  wherein said downstream replica current generator includes:
  a downstream replica current source;
  a downstream folding current source;
  a downstream replica capacitor coupled between said downstream replica current source and said downstream folding current source;
  a downstream replica transistor that drives said downstream replica capacitor in response to said analog signal; and
  a downstream folding transistor that couples said downstream replica capacitor to said downstream buffer transistor;
  and wherein said upstream replica current generator includes:
  an upstream replica current source;
  an upstream folding current source;
  an upstream replica capacitor coupled to said upstream folding current source;
  an upstream replica transistor that responds to said analog signal;
  an upstream replica buffer transistor that drives said upstream replica capacitor in response to said upstream replica transistor; and
  an upstream folding transistor that couples said upstream replica capacitor to said upstream buffer transistor.

25. The sampler of claim 24, wherein said downstream replica transistor receives said analog signal through said upstream buffer transistor.

26. The sampler of claim 24, wherein said downstream replica transistor receives said analog signal through said upstream replica transistor.

27. The sampler of claim 24, further including:
  a downstream switch in series with said sample capacitor;
  a mode switch arranged to control first and second sampler modes of said downstream buffer transistor; and
  an upstream switch positioned to isolate said mode switch from said upstream buffer transistor.

28. The sampler of claim 24, further including:
  a downstream switch in series with said sample capacitor; and
  a steering transistor coupled to steer a current to thereby control first and second sampler modes of said downstream buffer transistor.

29. A sampler that provides samples of an analog signal, comprising:
  an upstream buffer transistor for receiving said analog signal;
  a sample capacitor;
  a downstream buffer transistor positioned between said sample capacitor and said upstream buffer transistor to couple a sample of said analog signal to said sample capacitor in a first sampler mode and isolate said sample capacitor from said analog signal in a second sampler mode; and
  at least one of an upstream replica current generator and a downstream replica current generator that respectively provide an upstream replica current and a downstream replica current to thereby reduce current variations in a respective one of said upstream and downstream buffer transistors;
  wherein said downstream replica current generator includes:
  a downstream replica current source;
  a downstream folding current source;
  a downstream replica capacitor coupled between said downstream replica current source and said downstream folding current source;
  a downstream folding transistor that couples said downstream replica capacitor to said downstream buffer transistor; and
  a downstream replica transistor that drives said downstream replica capacitor;
  and wherein said upstream replica current generator includes:
  an upstream replica current source; and
  an upstream replica transistor that couples said upstream replica current source to said upstream buffer transistor and responds to an opposite polarity of said analog signal;

and further including a second upstream replica transistor that drives said downstream replica transistor in response to said analog signal.

30. The sampler of claim 29, further including:
a downstream switch in series with said sample capacitor;
a mode switch arranged to control first and second sampler modes of said downstream buffer transistor; and
an upstream switch positioned to isolate said mode switch from said upstream buffer transistor.

31. The sampler of claim 29, further including:
a downstream switch in series with said sample capacitor; and
a steering transistor coupled to steer a current to thereby control first and second sampler modes of said downstream buffer transistor.

* * * * *